US008589839B2

(12) United States Patent
Boselli et al.

(10) Patent No.: US 8,589,839 B2
(45) Date of Patent: Nov. 19, 2013

(54) ESD PROTECTION VALIDATOR, AN ESD VALIDATION SYSTEM AND A METHOD OF VALIDATING ESD PROTECTION FOR AN IC

(75) Inventors: Gianluca Boselli, Plano, TX (US); Jonathan S. Brodsky, Richardson, TX (US); John E. Kunz, Jr., Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 391 days.

(21) Appl. No.: 12/506,597

(22) Filed: Jul. 21, 2009

(65) Prior Publication Data

US 2010/0169854 A1 Jul. 1, 2010

Related U.S. Application Data

(60) Provisional application No. 61/141,650, filed on Dec. 30, 2008.

(51) Int. Cl.
*G06F 17/50* (2006.01)

(52) U.S. Cl.
USPC .......................................... 716/106; 716/102

(58) Field of Classification Search
USPC .............. 716/100–102, 106–108; 1/100–102, 1/106–108
See application file for complete search history.

(56) References Cited

U.S. PATENT DOCUMENTS

| 6,553,542 | B2 | 4/2003 | Ramaswamy et al. |
| 7,401,311 | B2 * | 7/2008 | Voldman ...................... 716/115 |
| 7,617,467 | B2 * | 11/2009 | Bell et al. ...................... 716/106 |
| 2004/0230933 | A1 * | 11/2004 | Weaver et al. .................. 716/12 |
| 2008/0148199 | A1 * | 6/2008 | Bell et al. .......................... 716/5 |

OTHER PUBLICATIONS

Boselli, et al.; "A System, An Apparatus and a Method for Performing Chip-Level Electrostatic Discharge Simulations"; U.S. Appl. No. 12/434,573, filed May 1, 2009.
Boselli, et al.; "A Method of Optimizing ESD Protection for an IC, An ESD Protection Optimizer and an ESD Protection Optimization System"; U.S. Appl. No. 12/434,578, filed May 1, 2009.

* cited by examiner

*Primary Examiner* — Binh Tat
(74) *Attorney, Agent, or Firm* — Alan A. R. Cooper; W. James Brady, III; Frederick J. Telecky, Jr.

(57) ABSTRACT

Disclosed is an electrostatic discharge (ESD) protection validator, a method of validating ESD protection for an IC and an ESD validation system. In one embodiment, the ESD protection validator includes: (1) a circuit analyzer configured to compare component information of the IC with predefined ESD protection elements to identify ESD cells of the IC and (2) an ESD cell verifier configured to compare physical attributes associated with the identified ESD cells to ESD protection requirements and determine compliance therewith.

16 Claims, 2 Drawing Sheets

ESD PROTECTION VALIDATOR, AN ESD VALIDATION SYSTEM AND A METHOD OF VALIDATING ESD PROTECTION FOR AN IC

CROSS-REFERENCE TO RELATED APPLICATION

This application claims the benefit of U.S. Provisional Application Ser. No. 61/141,650, filed by Gianluca Boselli, et al. on Dec. 30, 2008, entitled "METHOD TO VALIDATE AN ELECTROSTATIC DISCHARGE PROTECTION ELEMENT," commonly assigned with this application and incorporated herein by reference. This application is also related to the following U.S. Patent Applications, which are commonly assigned herewith and incorporated herein by reference:

Ser. No. 12/434,573, filed by Boselli, et al. on May 1, 2009, and entitled, "A SYSTEM, AN APPARATUS AND A METHOD FOR PERFORMING CHIP-LEVEL ELECTROSTATIC DISCHARGE SIMULATIONS;" and Ser. No. 12/434,578, filed by Boselli, et al. on May 1, 2009, and entitled, "A METHOD OF OPTIMIZING ESD PROTECTION FOR AN IC, AN ESD PROTECTION OPTIMIZER AND AN ESD PROTECTION OPTIMIZATION SYSTEM."

TECHNICAL FIELD

This application is directed, in general, to protecting integrated circuits (ICs) from electrostatic discharges (ESD) and, more specifically, to validating ESD protection for an IC.

BACKGROUND

ESD is the transfer of an electrostatic charge between two objects that can occur when two objects of different potentials come into direct contact with each other. In the semiconductor industry, the occurrence of an ESD event can be one of the leading causes for the failure of ICs. ESD protection for ICs is even growing in importance as the demand for higher operating speed, smaller operating voltages, higher packing density and reduced cost drives a reduction of device dimensions. Each of these factors can contribute to an increased sensitivity of ICs to damaging ESD events.

Semiconductor manufacturers may require a product to pass an ESD qualification before being released to customers to determine that ESD protection is provided and that the ESD protection complies with applicable requirements. To determine the existence and compliance of ESD protection, review teams may examine the schematic and layout of each IC. Typically, this examination process is manual and therefore can be tedious and time-consuming. Improved verification of ESD protection for ICs, therefore, would be useful in the art.

SUMMARY

One aspect provides an ESD protection validator. In one embodiment, the ESD protection validator includes: (1) a circuit analyzer configured to compare component information of the IC with predefined ESD protection elements to identify ESD cells of the IC and (2) an ESD cell verifier configured to compare physical attributes associated with the identified ESD cells to ESD protection requirements and determine compliance therewith.

In another aspect, a method of validating ESD protection for an IC is provided. In one embodiment, the method includes: (1) identifying ESD cells of the IC, (2) comparing physical attributes associated with the identified ESD cells to ESD protection requirements to determine compliance therewith and (3) providing a status of ESD protection compliance for the IC.

In yet another aspect, an ESD validation system is provided. In one embodiment, the ESD validation system includes: (1) a predefined ESD protection element database configured to store technology-independent topologies of ESD protection elements wherein each of the topologies has a defined set of attributes for each pair of terminals thereof, (2) an ESD protection element attributes database configured to store technology-dependent physical attributes associated with the ESD protection elements, (3) an ESD protection requirements database configured to store ESD protection requirements for an IC including IC attributes and application attributes for pins of the IC and (4) an ESD protection validator, having (4A) a circuit analyzer configured to provide identified ESD cells of the IC by comparing component information of the IC with the topologies of ESD protection elements and (4B) an ESD cell verifier configured to compare the physical attributes associated with the identified ESD cells to the ESD protection requirements and determine compliance therewith.

BRIEF DESCRIPTION

Reference is now made to the following descriptions taken in conjunction with the accompanying drawings, in which.

DETAILED DESCRIPTION

The disclosure relates to automated validation of ESD protection for pins of an IC. Validation of the ESD protection for an IC may include: (1) recognition of the existence of an ESD cell (i.e., an ESD protection cell) properly connected to each pin of the IC (i.e., is there an ESD cell at any given pin?), (2) verification of the compatibility of the aforementioned ESD cell with the building process for the IC (i.e., is the ESD cell compatible with the masks available in the building process?) and (3) verification of the compatibility of the aforementioned ESD cell with the protected pin requirements (i.e., is the ESD cell compatible with the pin in terms of ESD and functional requirements?).

Figure 1:
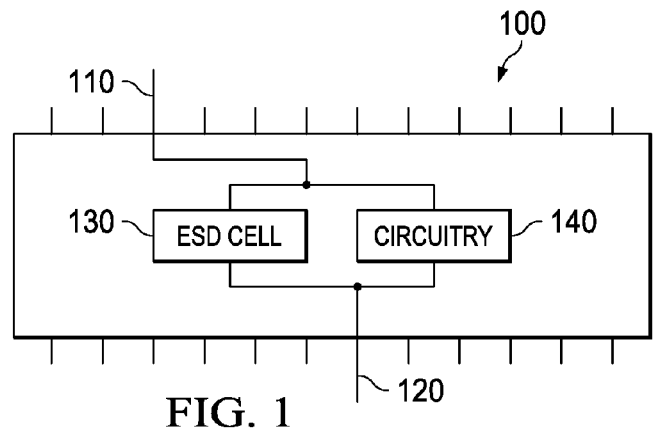
FIG. 1 is a block diagram of an IC having a plurality of pins.

The disclosure, therefore, provides automated validation of ESD protection for an IC at the design stage. Component information for an IC design (i.e., the IC) may be obtained from a schematic and layout of the IC. The IC component information may include the elements and describe the connectivity of the IC. A netlist from the IC's schematic and layout may be used to provide the IC component information. The netlist can be used to identify ESD cells of the IC and determine if pins of the IC are coupled to an ESD cell. A determination can also be made if the identified ESD cells of the IC comply with the applicable IC and pin requirements for ESD protection. A report can then be generated to indicate the existence of ESD protection and the compliance of the ESD protection with known requirements. The known requirements can be design and pin requirements for a desired IC. The requirements may vary per design and for the pins. The requirements can include voltage, power mask, load, etc. The known requirements can also include ESD requirements for a particular design or manufacturing node. The ESD requirements may be based on known manufacturing or industry standards. FIG. 1 provides an example of an IC and an ESD cell that may be validated according to the principles of this disclosure.

FIG. 1 is a block diagram of an IC 100 having a plurality of pins. The pins are conducting components that provide internal access to and external access for the IC 100. The pins may be referred to as external conductive extrusions. ESD cells are coupled to the plurality of pins to provide ESD protection for circuitry coupled to the pins. Pins 110 and 120 are denoted to represent the plurality of pins. Additionally, ESD cell 130 and circuitry 140 are illustrated to represent ESD cells and the circuitry that is protected from ESD events by the ESD cell 130.

For example, the ESD cell 130 may include suppression components that protect the circuitry 140 coupled between the pins 110, 120, from an ESD voltage. The compression components may clamp the ESD voltage to an appropriate level that the circuitry 140 can survive. Connected in parallel with the circuitry 140, the ESD cell 130 can clamp the ESD voltage and shunt at least a majority of the ESD current away from the circuitry 140 to an appropriate dissipation reference.

Figure 2:
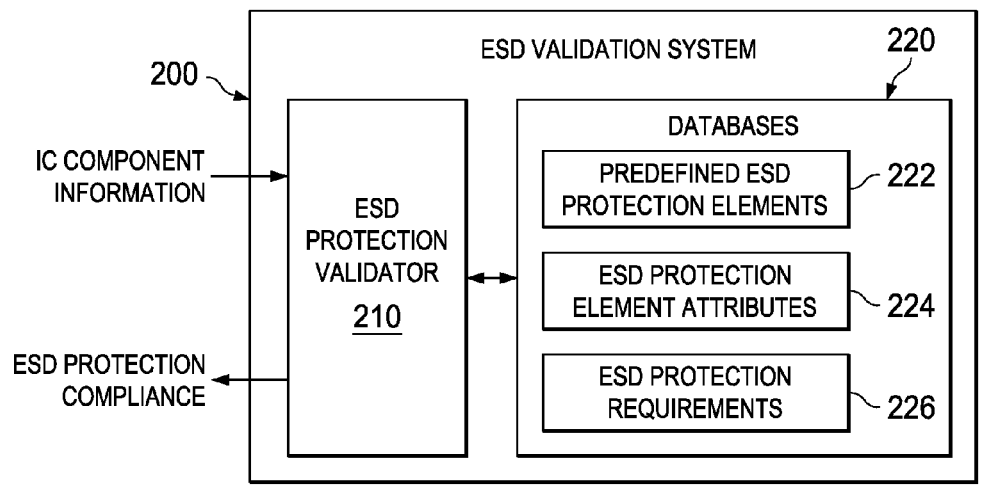
FIG. 2 is a block diagram of an embodiment of a ESD validation system constructed according to the principles of the disclosure.

FIG. 2 is a block diagram of an embodiment of an ESD protection validation system 200 constructed according to the principles of the disclosure. The ESD validation system 210 includes an ESD protection validator 210 and ESD protection databases 220. The databases 220 include a database for predefined ESD protection elements 222, ESD protection element attributes 224 and ESD protection requirements 226. Each database of the databases 220 may be a conventional database.

The ESD protection validator 210 is configured to validate ESD protection for an IC based on component information of the IC, predefined ESD protection element topologies, ESD protection element physical attributes associated with the predefined ESD protection element topologies and ESD protection requirements. The component information for the IC may be obtained from the schematic and the layout of the IC. In one embodiment, the IC component information is obtained from a netlist generated from the schematic and layout. An embodiment of an ESD protection validator is discussed in more detail with respect to FIG. 3.

The ESD protection validator 210 or at least a portion thereof may be embodied as a series of operating instructions stored on a computer readable storage medium that directs the operation of a processor when executed thereby. In one embodiment the ESD protection validator 210 may be a dedicated computing-device having the necessary circuitry to perform the functions described herein.

The predefined ESD protection element database 222 is configured to store technology-independent topologies of ESD protection elements. The topologies represent the physical and logical structure of ESD protection elements. The topologies may represent the ESD protection elements as n-terminal "black boxes" having any m components connected between the n terminals in any given fashion. For example, a topology may have two, three, four or more terminals. The terminals may be reference terminals, power terminals, input terminal, etc. Each of the topologies of the ESD protection elements has a defined set of attributes for each pair of terminals of the topologies. The stored topologies, therefore, represent known ESD protection elements.

The ESD protection element attributes database 224 is configured to store technology-dependent physical attributes associated with the ESD protection elements. The technology-dependent attributes includes attributes that are terminal-independent. The terminal-independent attributes may include (but are not limited to) applications for the associated ESD protection element, fail-safe/non-fail-safe, powered-off (yes/no), mask levels used, ESD performance and maximum allowed dV/dt (V/sec). The attributes included in the ESD protection element attributes database 224 may also include terminal-dependent attributes for ESD protection components. The terminal dependent attributes may include (but not limited to) operating voltage, DC Vhold and Ihold (V), maximum/minimum DC leakage current (A) and maximum displacement current (A).

The ESD protection requirements database 226 is configured to store ESD protection requirements for an IC including IC attributes and application attributes for pins of the IC. The ESD protection requirements, or at least some thereof, may correlate with the ESD protection element attributes stored in the ESD protection element attributes database 224. The IC attributes may include, for example, the technology, unused mask levels, operating environment temperature range (degrees C), ESD requirements (customer additions, customer waivers) and latch-up test current (A). The pin application attributes may include, for example, application type (substrate ground, noise-isolated ground, power-supply, regulator output, charge pump, programming pin, input, output), ESD requirements (customer additions and waivers), operating voltage (minimum operating voltage (V), absolute minimum voltage (V), maximum operating voltage (V), absolute maximum voltage (V)), maximum over-voltage/minimum under-voltage (V), maximum DC leakage current (A), special requirements (value field), maximum dV/dt (V/sec) displacement current (A) for specified maximum dV/dt, fail-safe/non-fail-safe, minimum positive Vhold (V) and maximum negative Vhold (V), maximum series resistance in series with internal circuitry, maximum shunt capacitance load (F) for primary ESD cells and maximum dC/dV (F/V) for primary ESD cells.

Figure 3:
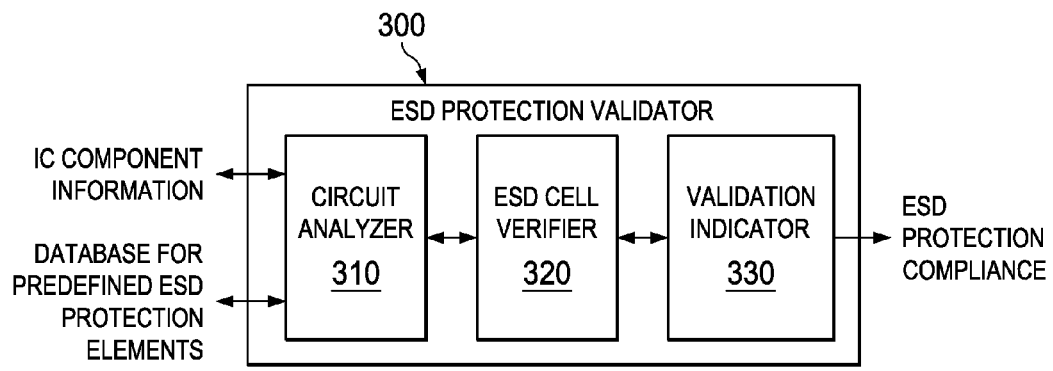
FIG. 3 is a block diagram of an embodiment of an ESD protection validator constructed according to the principles of the disclosure.

FIG. 3 is a block diagram of an embodiment of an ESD protection validator 200 constructed according to the principles of the disclosure. The ESD protection validator 200 includes a circuit analyzer 310, an ESD cell verifier 320 and a validation indicator 330.

The circuit analyzer 310 is configured to identify ESD cells of the IC by comparing component information of the IC with predefined ESD protection elements. The component information used by the circuit analyzer 310 may be obtained from a netlist of the IC. The circuit analyzer 310 may employ a pattern matching engine to compare the IC component information with the predefined ESD protection elements to determine the identified ESD cells of the IC.

The ESD cell verifier 320 is configured to compare physical attributes associated with the identified ESD cells to ESD protection requirements and determine compliance therewith. The physical attributes may be associated with the ESD cells via the predefined ESD protection elements that are used to identify the ESD cells. The ESD cell verifier 320 is also configured to determine if pins of the IC have an ESD cell coupled thereto. In one embodiment, the ESD cell verifier 320 is configured to determine if each of the pins of the IC have an ESD cell coupled thereto. The ESD cell verifier 320 is further configured to associate the physical attributes with the identified ESD cells. The ESD cell verifier 320 may associate physical attributes with the ESD cells that are terminal-independent or terminal-dependent. The physical attributes may correlate with the ESD protection requirements that are saved, for example, in the ESD protection requirement database 226.

The validation indicator 330 is configured to provide a status of ESD protection compliance for the IC. The validation indicator 330 may generate electrical signals to represent the status. The validation indicator 330 may include a display that employs the generated electrical signals to display the status. Additionally, the validation indicator 330 may use the generated electrical signals to cause the status to be printed. The status of ESD protection compliance for the IC may include a report on the number of pins that are coupled to an ESD cell and those pins that are not coupled thereto. The status may simply include that each pin of the IC is coupled to an ESD cell. The status may also include that the identified ESD cells do comply with the ESD protection requirements. Non-compliant cells can be noted and examined further.

Figure 4:
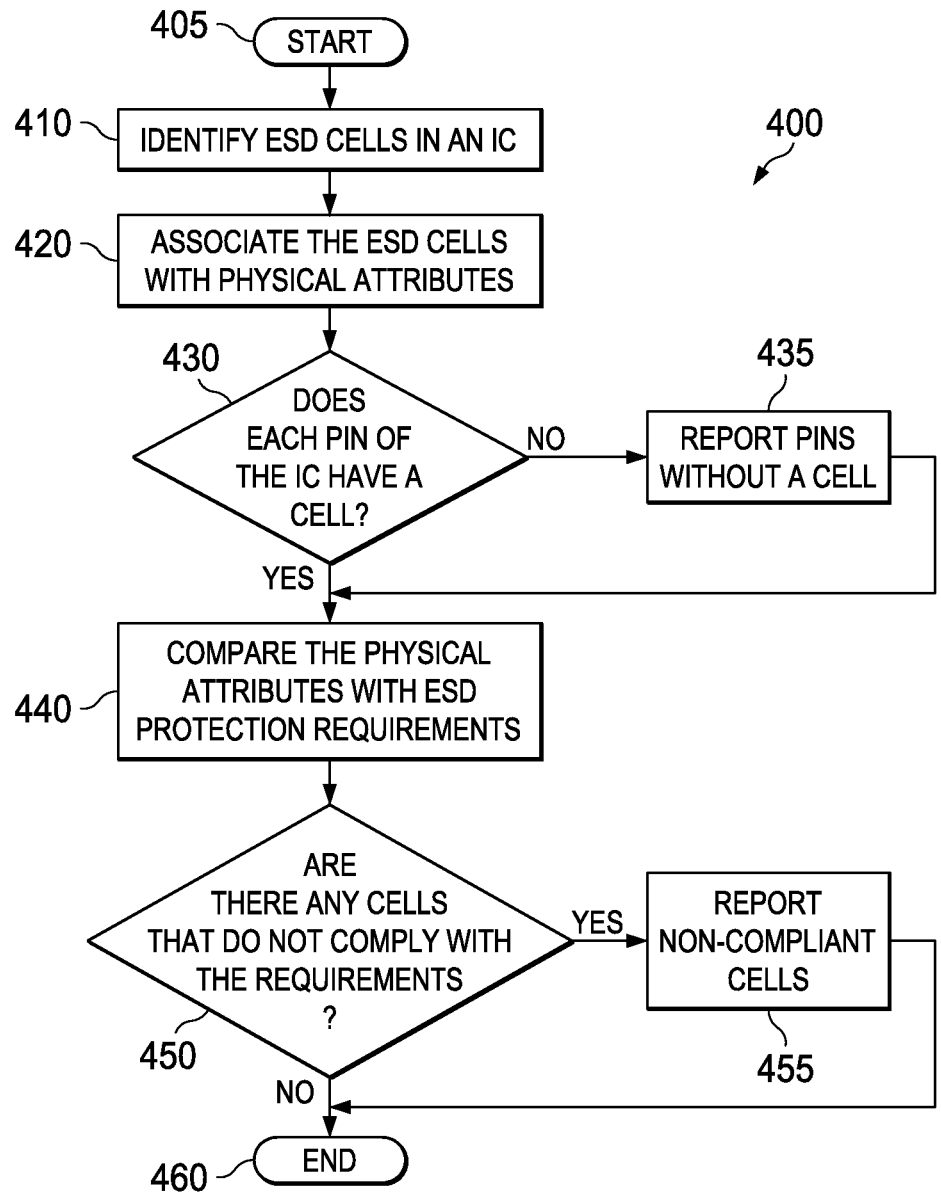
FIG. 4 is a flow diagram of an embodiment of a method of validating an ESD protection element according to the principles of the disclosure.

FIG. 4 is a flow diagram of an embodiment of a method 400 of validating ESD protection for an IC according to the principles of the disclosure. The method 400 may be implemented as a series of computer executable instructions, stored on a computer-readable storage medium, that direct the operation of a processor when executed. In one embodiment, the method 400 may be performed by a dedicated computer specifically programmed for executing the steps thereof. For example, an ESD protection validator or an ESD validation system may be employed to perform at least some of the steps of the method 400. The method 400 begins in a step 405.

In a step 410, ESD cells of an IC are identified. In one embodiment, all of the ESD cells of the IC are identified. The ESD cells of the IC may be identified using a pattern matching engine and a predefined ESD protection element database. The pattern matching engine can compare IC component information to ESD protection elements of the database to identify ESD cells of the IC. The IC component information may be from a netlist generated from a schematic and layout of the IC. Thus, the pattern matching engine may be configured to compare and match an input string from the IC component information to a group of predefined string patterns representing predefined or known ESD protection elements.

After identifying the ESD cells of the IC, physical attributes are associated with the identified ESD cells in a step 420. The physical attributes may be associated by identifying attributes in an ESD protection element attributes database that are designated for specific ESD protection elements such as the identified ESD protection elements.

The method 400 continues where a determination is made in a first decisional step 420 if every pin of the IC is coupled to at least one of the identified ESD cells. If each pin of the IC is coupled to an ESD cell, then a comparison is performed between the associated attributes and ESD protection requirements for the IC. The ESD protection requirements may be stored in a database. Terminal independent attributes of the identified ESD cells may be compared to IC attributes stored in an ESD protection requirements database. Additionally, terminal dependent attributes of the identified ESD cells may be compared to pin application attributes of the ESD protection requirements.

A determination is then made in a second decisional step 450 if any of the identified ESD cells do not comply with the ESD protection requirements. If there are no identified ESD cells that do not comply, then the method 400 ends in step 460. If there is one or more identified ESD cells that do not comply, then the method continues to a step 455 where a report is generated identifying those cells that do not comply. Electrical signals may be generated to provide the report. The report may be provided via a visual display. The method 400 then continues to step 460 and ends.

Returning now to the first decisional step 430, if every pin of the IC is not coupled to one of the identified ESD cells, then a report is generated in a step 435 identifying those pins that are not coupled thereto. The method 400 then continues to step 440.

The above-described system and methods may be embodied in or performed by various conventional digital data processors or computers, wherein the computers are programmed or store executable programs of sequences of software instructions to perform one or more of the steps of the methods, e.g., steps of the method of FIG. 4. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 4. Additionally, a dedicated apparatus or a system, such as, an ESD protection validator or and ESD validation system, may be designed to include the necessary circuitry to perform each step of the method of FIG. 4.

Those skilled in the art to which this application relates will appreciate that other and further additions, deletions, substitutions and modifications may be made to the described embodiments.

What is claimed is:

1. An electrostatic discharge (ESD) protection validator for an integrated circuit (IC), comprising:
   a circuit analyzer configured to compare component information of said IC with predefined ESD protection elements to identify ESD cells of said IC, wherein said component information is received from a netlist;
   wherein said circuit analyzer is configured to employ a pattern matching engine at a netlist level of abstraction to compare said IC component information with said predefined ESD protection elements, also at a netlist level of abstraction, to determine said identified predefined ESD cells existing in the netlist, said determining occurring at said netlist level of abstraction;
   an ESD cell verifier configured to compare physical attributes associated with said identified ESD cells, to ESD protection requirements and determine compliance therewith, said comparison performed with said netlist, and
   wherein said ESD cell verifier is configured to determine if each of said pins of said IC has an ESD cell coupled thereto.

2. The ESD protection validator as recited in claim 1 wherein said ESD cell verifier is further configured to associate said physical attributes with said identified ESD cells.

3. The ESD protection validator as recited in claim 1 further comprising a validation indicator configured to provide a status of ESD protection compliance for said IC.

4. The ESD protection validator as recited in claim 1 wherein said circuit analyzer is configured to employ a pattern matching engine to compare said IC component information with said predefined ESD protection elements to determine said identified predefined ESD cells.

5. The ESD protection validator as recited in claim 1, wherein any variance between an ESD cell attribute and its corresponding pin attribute is reported.

6. The ESD protection validator of claim 1, wherein said predefined DSD protection elements are stored in a database.

7. A method of validating electrostatic discharge (ESD) protection for an integrated circuit (IC), comprising:
  identifying ESD cells of said IC by using a computer, wherein
    said identifying is performed with a netlist, and
    said identifying includes comparing:
      a) IC component information of said IC received from the netlist to
      b) predefined ESD protection elements,
    to determine said identified predefined ESD cells, wherein said identifying employs a pattern matching engine at a netlist level of abstraction to compare said IC component information with said predefined ESD protection elements, also at a netlist level of abstraction, to determine said identified predefined ESD cells existing in the netlist, said determining occurring as said netlist level of abstraction;
  determining if each of said pins of said IC has an ESD cell coupled thereto;
  comparing physical attributes associated with said identified ESD cells to ESD protection requirements to determine compliance therewith by an ESD cell verifier, said comparison performed with said netlist; and
  generating electrical signals to provide a status of ESD protection compliance for said IC.

8. The method as recited in claim 7 further comprising associating said physical attributes with said identified ESD cells.

9. The method as recited in claim 7 wherein said status indicates which of said pins is not coupled to at least one of said identified ESD cells.

10. The method as recited in claim 7 wherein said status indicates which of said identified ESD cells does not comply with said ESD protection requirements.

11. The method as recited in claim 8 wherein said comparing includes employing a pattern matching engine to compare said IC component information with said predefined ESD protection elements to determine said identified predefined ESD cells.

12. An electrostatic discharge (ESD) protection validation system for integrated circuits (ICs) comprising:
  a predefined ESD protection element database configured to store technology-independent topologies of ESD protection elements wherein each of said topologies has a defined set of attributes for each pair of terminals thereof;
  an ESD protection element attributes database configured to store technology-dependent physical attributes associated with said ESD protection elements;
  an ESD protection requirements database configured to store ESD protection requirements for an IC including IC attributes and application attributes for pins of said IC; and
  an ESD protection validator, comprising:
    a circuit analyzer configured to provide identified ESD cells of said IC by comparing component information of said IC with said topologies of ESD protection elements, wherein said component information is received from a netlist;
    wherein said circuit analyzer is configured to employ a pattern matching engine at a netlist level of abstraction to compare said IC component information with said predefined ESD protection elements, also at a netlist level of abstraction, to determine said identified predefined ESD cells existing in the netlist, said determining occurring as said netlist level of abstraction;
    an ESD cell verifier configured to compare said physical attributes associated with said identified ESD cells to said ESD protection requirements and determine compliance therewith, said comparison performed with said correlated netlist, and
    wherein said ESD cell verifier is configured to determine if each of said pins of said IC has an ESD cell coupled thereto.

13. The ESD protection validation system as recited in claim 12 wherein said ESD cell verifier is further configured to associate said physical attributes with said identified ESD cells.

14. The ESD protection validation system as recited in claim 12 wherein said ESD protection validator further includes a validation indicator configured to provide a status of ESD protection compliance for said IC.

15. The ESD protection validation system as recited in claim 12 wherein said circuit analyzer is configured to employ a pattern matching engine to compare said IC component information with said predefined ESD protection elements to determine said identified predefined ESD cells.

16. An electrostatic discharge (ESD) protection validator for an integrated circuit (IC), comprising:
  a circuit analyzer configured to compare component information of said IC with predefined ESD protection elements to identify ESD cells of said IC,
  wherein said component information is received from a netlist; and
  wherein said circuit analyzer is configured to employ a pattern matching engine at a netlist level of abstraction to compare said IC component information with said predefined ESD protection elements also at a netlist level of abstraction to determine said identified predefined ESD cells existing in the netlist, said determination occurring at said netlist level of abstraction an ESD cell verifier configured to compare physical attributes associated with said identified ESD cells, to ESD protection requirements and determine compliance therewith, said comparison performed with said netlist,
  wherein said ESD cell verifier is configured to determine if each of said pins of said IC has an ESD cell coupled thereto.

* * * * *